(12) United States Patent
Bucchignano et al.

(10) Patent No.: US 7,659,050 B2
(45) Date of Patent: Feb. 9, 2010

(54) HIGH RESOLUTION SILICON-CONTAINING RESIST

(75) Inventors: James J. Bucchignano, Yorktown Heights, NY (US); Wu-Song S. Huang, Poughkeepsie, NY (US); David P. Klaus, Yorktown Heights, NY (US); Lidija Sekaric, Mount Kisco, NY (US); Raman G. Viswanathan, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 11/146,871

(22) Filed: Jun. 7, 2005

(65) Prior Publication Data

US 2006/0275694 A1 Dec. 7, 2006

(51) Int. Cl.
*H01L 21/00* (2006.01)
*G03C 1/00* (2006.01)

(52) U.S. Cl. .................................. 430/311; 430/270.1

(58) Field of Classification Search ................. 430/311, 430/296, 302, 313, 270.1
See application file for complete search history.

(56) References Cited

U.S. PATENT DOCUMENTS

| | | | | |
|---|---|---|---|---|
| 4,011,351 A * | 3/1977 | Gipstein et al. | ............. | 430/296 |
| 4,395,481 A | 7/1983 | Birkle et al. | | |
| 4,454,222 A | 6/1984 | Tada et al. | | |
| 4,600,685 A * | 7/1986 | Kitakohji et al. | ............. | 430/313 |
| 4,745,169 A * | 5/1988 | Sugiyama et al. | ............. | 528/43 |
| 5,489,678 A | 2/1996 | Fodor et al. | | |
| 5,554,465 A * | 9/1996 | Watanabe | ...................... | 430/5 |
| 6,303,268 B1 * | 10/2001 | Namba et al. | ............ | 430/270.1 |
| 6,420,084 B1 * | 7/2002 | Angelopoulos et al. | .. | 430/270.1 |
| 6,492,089 B2 * | 12/2002 | Hatakeyama et al. | .... | 430/270.1 |
| 6,806,361 B1 | 10/2004 | Kajisa et al. | | |
| 6,939,664 B2 * | 9/2005 | Huang et al. | ............. | 430/270.1 |
| 2002/0081520 A1 * | 6/2002 | Sooriyakumaran et al. | ........................ | 430/270.1 |
| 2002/0090572 A1 * | 7/2002 | Sooriyakumaran et al. | ........................ | 430/271.1 |
| 2005/0009982 A1 * | 1/2005 | Inagaki et al. | ................ | 524/588 |

FOREIGN PATENT DOCUMENTS

CN 1526752 9/2004

OTHER PUBLICATIONS

"Resist Road to the 22 nm Technology Node", by U. Okoroanyanwu, J.H. Lammers, Future Fab International Issue 17, Lithography, Equipment and Materials.
"Sub-50 nm Half Pitch Imaging with a Low Activation Energy Chemically Amplified Photoresist", G.M. Wallraf, C.E. Larson, M. Sanchez, C. Rettner, B. Davis, L. Sundberg, W.D. Hinsberg, F.A. Houle, J. A. Hoffnagle, D.R. Medeiros, W-S Huang, K. Petrillo, D. Goldfarb, K. Temple, S. Wind, J. Bucchignano.
"Electron Beam Lithography", http://www.rpi.edu/dept/materials/COURSES/NANO/nugent/ebeam.html.

* cited by examiner

*Primary Examiner*—Cynthia H Kelly
*Assistant Examiner*—Connie P Johnson
(74) *Attorney, Agent, or Firm*—Wenjie Li; Steven Capella

(57) ABSTRACT

Non-chemically amplified radiation sensitive resist compositions containing silicon are especially useful for lithographic applications, especially E-beam lithography. More particularly, radiation-sensitive resist compositions comprising a polymer having at least one silicon-containing moiety and at least one radiation-sensitive moiety cleavable upon radiation exposure to form aqueous base soluble moiety can be used to pattern sub-50 nm features with little or no blur.

12 Claims, No Drawings

HIGH RESOLUTION SILICON-CONTAINING RESIST

STATEMENT OF GOVERNMENT INTEREST

This invention was made with Government support under Contract No. N-66001-00-C-8083 awarded by the Department of the Navy, Space and Warfare Systems Center. The Government has certain rights in this invention.

BACKGROUND OF THE INVENTION

In the microelectronics industry, there is a continued desire to reduce the size of structural features and/or to provide greater amount of circuitry for a given chip size. Advanced lithographic techniques are required to fabricate high performance and high density circuitry. Lithography impacts the manufacture of microscopic structures not only in terms of directly imaging patterns on the desired substrate, but also in terms of making masks typically used in such imaging.

Over approximately the last 20 years, the industry has migrated to shorter wavelength photolithography as the primary means of scaling the resolution to sustain the progressive demand for smaller features. The wavelength of imaging radiation used in photolithography has migrated from mid-ultraviolet (MUV) wavelengths (350-450 nm) to deep-UV (DUV) radiation (190-300 nm) and toward vacuum UV (VUV, 125-160 nm). Likewise the radiation-sensitive resist materials used in photolithography have evolved. MUV lithography employed diazonaphthoquinone (DNQ) and novolac-based resists. These materials offered high performance but were not extendible to DUV and VUV wavelengths due to their opacity at these shorter wavelengths. In addition, these resists were not of sufficient sensitivity to afford high throughput manufacturing.

Chemically amplified resists (CARs) were developed in response to the need for new resist materials for use in DUV photolithography. For positive tone CARs, labile moieties of the polymer are cleaved by acid-catalyzed thermolysis reaction (the acid-catalyzed reaction using photochemically-generated acid from a radiation-sensitive acid generator) that renders the resulting (deprotected) form of the polymer soluble in a subsequently applied developer, such as aqueous base. Thus, an image of the projected patternwise radiation is formed in the resist film after development, which can then serve as an etch-resistant mask for subsequent pattern transfer steps. The resolution obtained is dependent on quality of aerial image and ability of resist to maintain that image.

One barrier to imaging in the sub-50 nm half-pitch regime is a phenomenon known as image blur which diminishes the integrity of the pattern. Image blur can be defined as the deviation of the developable image from that of projected aerial image which is transferred into the film as the concentration of photochemically generated acid. While accelerating the rate of the deprotection reaction, the application of thermal energy diminishes the fidelity of the aerial image of acid formed during the patternwise exposure. Image blur can be divided into two contributing factors: gradient-driven acid diffusion and reaction propagation. Both factors contribute to blur, but to different degrees and with different temperature dependence. Both of these contributing factors can be tempered by the addition of acid-quenchers, or bases, which have been shown to reduce image blur. Appropriate baking conditions can optimize the resolution attainable with CARs. However, these approaches only reduce the image blur to low blur imaging.

For E-beam lithography (where an electron beam is used as the imaging radiation), currently there is a desire to image sub-50 nm features in the context of direct write applications and possibly in the future for mask-making where the imaging radiation is imaging even finer features (e.g., in the case of extreme UV imaging). At such scale, blur is especially problematic.

Non-chemically amplified (non-CA) resists and low activation (energy) protecting group resists have been proposed to achieve high resolution, low blur. Conventional DNQ systems are non-CA resists which have poor performance in E-beam lithography. Poly(methyl methacrylate) (PMMA) is a well known non-CA resist which undergoes main chain scission with a low quantum yield of 0.04 to 0.14, depending on the intensity and wavelength of the radiation. Side chain scission with a minute quantum yield of $10^{-6}$ has also been reported, but is too inefficient for practical resist applications. PMMA polymer also requires solvent as developer. Another well known non-CA E-beam resists are based on polybutene sulfone, however, these resists are not etch resistant (for reactive ion etching (RIE)), and thus the pattern cannot be transferred by a RIE process.

Another approach to improved resolution involves the use of multilayer (e.g., bilayer) resist systems where the resist layer itself is thinned to enhance resolution. The typical imaging resists for bilayer lithography contain silicon. Silicon-containing CA resists developed for short wavelength (e.g., 157 nm or greater) imaging are described in US patent publication Nos. 20020090572 and 20020081520. Multilayer resist systems are generally more complex and expensive to implement. It is not apparent that these systems would be usable with e-beam radiation or would be free of blur problems.

Thus, there is a need for improved resists for sub-50 nm lithography, especially for e-beam lithography. There is especially a need for resist compositions useful in e-beam lithography which resists provide good etch resistance toward oxygen plasma, good resolution, reasonable sensitivity to imaging radiation and minimal vulnerability to airborne base contamination.

SUMMARY OF THE INVENTION

The invention provides improved resist compositions which are especially useful for sub-50 nm lithography, more especially where the imaging radiation is e-beam radiation. The compositions of the invention provide a combination of etch resistance toward oxygen plasma, substantially blur-free resolution, reasonable sensitivity to imaging radiation, and minimal vulnerability to airborne base contamination. The resist compositions of the invention are preferably not chemically-amplified.

In one aspect, the invention encompasses resist compositions comprising a polymer having at least one silicon-containing moiety and at least one radiation-sensitive moiety cleavable upon irradiation to form an aqueous base-soluble moiety. The radiation-sensitive moiety is preferably selected from carbonyl, sulfonyl, sulfonate ester, alkanethiol, and O-nitrobenzyl. The silicon-containing moiety is preferably an Si—O moiety. More preferably, the silicon-containing moiety forms part of the polymer backbone (e.g., a polyorganosiloxane or a polyorganosilsesquioxane). The polymer also preferably contains (prior to exposure to imaging radiation) at least one aqueous base soluble moiety. The polymer may contain other moieties as well.

DETAILED DESCRIPTION OF THE INVENTION

The invention also encompasses methods of forming patterned structures on substrates using the resist compositions of the invention.

These and other aspects of the invention are described in further detail below.

The resist compositions of the invention generally significantly reduce or eliminate the image blur problem commonly seen in chemically amplified resists. The resist compositions of the invention provide a combination of etch resistance toward oxygen plasma, substantially blur-free resolution, reasonable sensitivity to imaging radiation, and minimal vulnerability to airborne base contamination. The resist compositions are preferably developable in aqueous base. These features make the resist compositions of the invention especially suitable for imaging sub-50 nm features, especially using e-beam imaging radiation.

The resist compositions of the invention are characterized by the presence of a polymer having at least one silicon-containing moiety and at least one radiation-sensitive moiety cleavable upon irradiation to form an aqueous base-soluble moiety. The polymer also preferably contains (prior to exposure to imaging radiation) at least one aqueous base soluble moiety. The polymer may contain other moieties as well. The resist compositions of the invention are preferably not chemically amplified.

The radiation sensitive moiety is one which cleaves upon exposure to imaging radiation such that an aqueous base-soluble moiety is created. The imaging polymer preferably contains a sufficient number of such radiation sensitive moieties that the solubility of the irradiated resist is increased sufficiently to render it substantially more soluble in aqueous developer compared to the non-irradiated resist.

The radiation sensitive moiety is preferably selected from the group consisting of carbonyl, sulfonyl, sulfonate ester, alkanethiol, O-nitrobenzyl and combinations thereof. U.S. Pat. Nos. 6,806,361 and 5,489,678 describe some possible radiation sensitive moieties as listed below: 6-nitroveratryl, 6-nitropiperonyl, methyl-6-nitroveratryl, methyl6-nitropiperonyl, and 1-pyrenylmethyl, 6-nitroveratryloxycarbonyl, 6-nitropiperonyloxycarbonyl, methyl-1-nitroveratryloxycarbonyl, methyl-6-nitropiperonyloxycarbonyl, 1-pyrenylmethyloxycarbonyl, 5'-O-pyrenylmethyloxy carbonyl, methylnitropiperonyloxycarbonyl, and 5'-X-2'-deoxythymidine 2-cyanoethyl 3'-N,N-diisopropylphosphoramidites where X is a photolabile group such as: ((.alpha.-methyl-2-nitropiperonyl)-oxy)carbonyl, ((Phenacyl)-oxy)carbonyl, O-(9-phenylxanthen-9-yl), and ((2-methylene-9,10-anthraquinone)-oxy)carbonyl. Additionally, carbonyl esters found in some PMMA-type resists may be useful as radiation sensitive moieties. See for example carbonyl ester moieties described in U.S. Pat. Nos. 4,395,481, 4,011,351 and 4,454,222.

One preferred group of radiation sensitive carbonyl moieties has the structure indicated below:

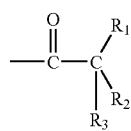

(I)

wherein each of $R_1$, $R_2$, or $R_3$ is selected from the group consisting of linear or branched alkyl, cycloalkyl, aryl and any combination thereof; each of $R_1$, $R_2$, or $R_3$ may link to one or two of the other to form cyclic structures; each of $R_1$, $R_2$, or $R_3$ may further comprise oxygen, sulfur, nitrogen, fluorine, chlorine, iodine and the combination thereof. In another more preferred embodiment, one of the $R_1$, $R_2$, or $R_3$ may be replaced with a moiety containing oxygen, sulfur, nitrogen, fluorine, chlorine, iodine. A preferred embodiment of this moiety has the structure:

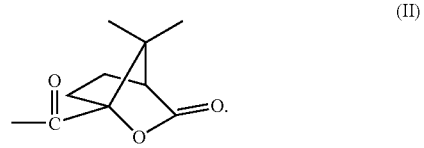

(II)

The silicon-containing moiety is preferably present in an amount such that the polymer contains at least 4 wt. % silicon, more preferably at least 6 wt. % silicon. The silicon-containing moieties are preferably selected from the group consisting of Si—Si, Si—C, Si—N or Si—O and combinations thereof. Preferred silicon-containing moieties are the SiO moieties. The silicon-containing moieties may be in the polymer backbone and/or in pendant groups. The silicon-containing moiety preferably forms part of the polymer backbone (e.g., a polyorganosiloxane or a polyorganosilsesquioxane).

The polymer also preferably contains (prior to exposure to imaging radiation) a plurality of aqueous base soluble sites distributed along the polymer. Some examples of base soluble moieties include hydroxyl, carboxylic acid, sulfonamide, dicarboxyimide, N-hydroxy dicarboxyimide, any other amino group or any imino group. Preferably, the base soluble moiety is a hydroxyl group, more preferably a fluoroalcohol moiety, and most preferably trifluorocarbinol or hexafluorocarbinol.

One preferred group of embodiments described below is based on polymers having a silsesquioxane (ladder or network) structure with pendant radiation sensitive groups and pendant base soluble groups.

The radiation sensitive moiety cleavable upon radiation to form aqueous base soluble moiety is preferably pendant from a monomer unit with the following structure:

(III)

where $R_4$ comprises at least one of the radiation sensitive moieties described above and x is preferably from about 1 to about 1.95, more preferably from about 1 to about 1.75.

Some examples of structure (III) are:
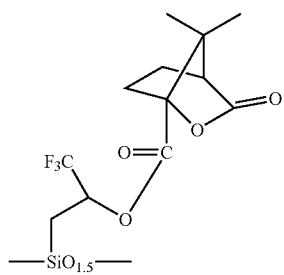
(IV)
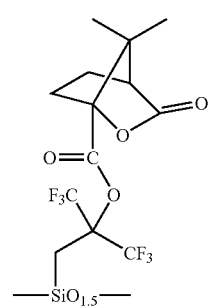
(V)
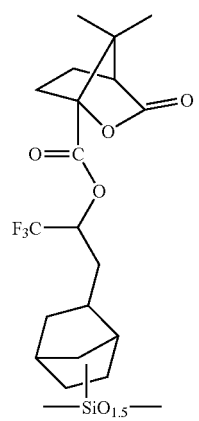
(VI)
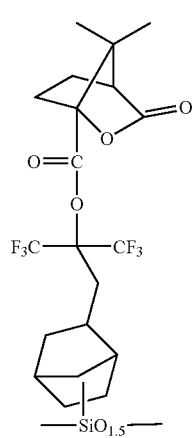
(VII)
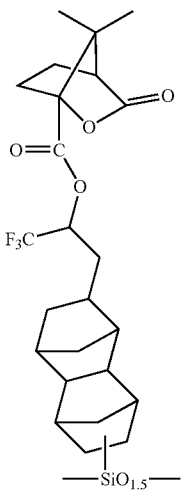
(VIII)
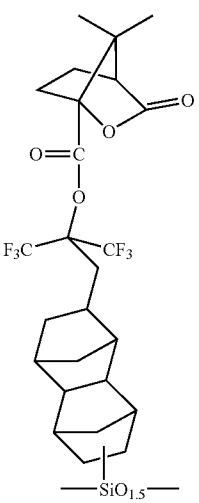
(IX)
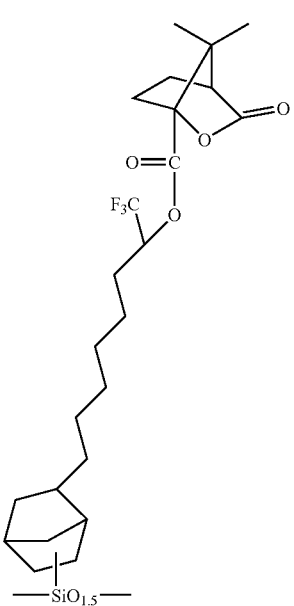
(X)

-continued

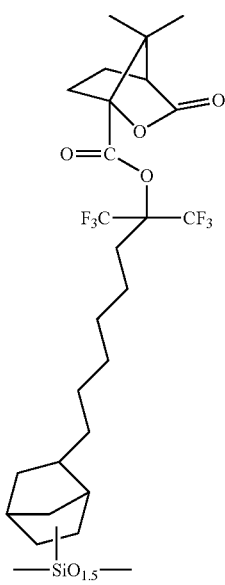
(XI)

In these embodiments, the pendant base soluble groups are preferably pendant from silsesquioxane monomer units as in the following structure:

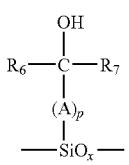
(XII)

where $R_5$ comprises an aqueous base soluble moiety, and x is preferably from about 1 to about 1.95, more preferably from about 1 to about 1.75. In this embodiment, $R_5$ is preferably a hydroxyl or carboxylic acid moiety, more preferably a hydroxyl moiety, most preferably a fluoroalcohol. Other acceptable aqueous base soluble moieties in $R_5$ include sulfonamides, dicarboxyimides, N-hydroxy dicarboxyimides, any other amino groups or any imino groups. $R_5$ may also include fluorinated versions of such solubility promoting moieties. The base soluble moieties are most preferably present as monomer units having the following structure:

(XIII)
$$R_6-\underset{\underset{-\mathrm{SiO}_x-}{|}}{\overset{\overset{\mathrm{OH}}{|}}{\underset{(A)_p}{C}}}-R_7$$

where:

each $R_6$ is independently selected from any of a fluorine, a fluorinated linear or branched alkyl, a fluorocycloalkyl, a fluoroaryl, and any combination thereof, and $R_6$ may optionally further include any of oxygen, sulfur or nitrogen;

each A is independently selected from any one of an oxygen atom, a sulfur atom, $NR_7$, a linear or branched alkyl, a linear or a branched fluoroalkyl, a cycloalkyl or fluorocycloalkyl, and a fluoroaryl;

p is an integer having the value 0 or 1 (i.e., including a single bond between a silicon atom of the silsesquioxane group and a carbon atom of a side group);

each $R_7$ is independently selected from any of hydrogen, halogen, linear or branched alkyl, linear or branched fluoroalkyl, cycloalkyl, fluorocycloalkyl, fluoroaryl, and any combination thereof; and $R_6$ and $R_7$ may optionally further include any of oxygen, sulfur or nitrogen, or any combination thereof.

Some examples of structure (XIII) are:

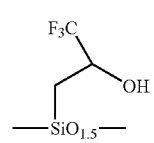
(XIV)

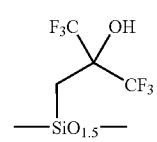
(XV)

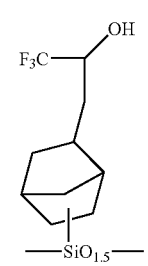
(XVI)

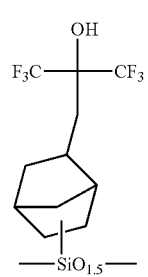
(XVII)

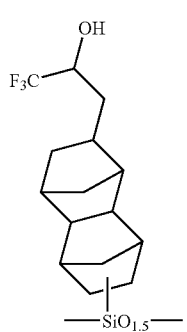
(XVIII)

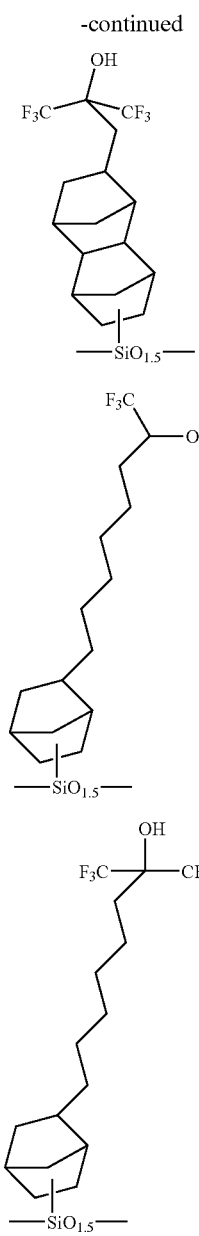

(XIX)

(XX)

(XXI)

The polymer should have solution and film-forming characteristics conducive to forming a layer by conventional spin-coating. The polymers of the invention preferably have a weight average molecular weight of at least about 800, more preferably a weight average molecular weight of about 1000-50000, and most preferably a weight average molecular weight of about 1500-10000.

The radiation sensitive compositions of the invention generally include a casting solvent to dissolve the other components so that the overall composition may be applied evenly on the substrate surface to provide a defect-free coating. Where the resist composition is used in a multilayer imaging process, the solvent used in the imaging layer resist is preferably not a solvent to the underlayer materials, otherwise the unwanted intermixing may occur unless the underlayer composition uses a crosslinker approach. Examples of suitable casting solvents include: ethoxyethylpropionate ("EEP"), a combination of EEP and γ-butyrolactone ("GBL"), propylene-glycol methyl ether acetate (PGMEA), and ethyl lactate. The invention is not limited to selection of any particular solvent. The radiation sensitive compositions may further comprise surfactants, sensitizers or other expedients known in the art. The compositions of the present invention are not limited to any specific selection of these expedients.

The resist compositions of the invention are preferably not chemically amplified, thus there is generally no need to add photoacid generator (PAG) to the formulation. However, in some cases it may be desirable to add a PAG to the formulation to enhance chemical contrast or improve dissolution properties in aqueous base developer. The composition contains polymer which comprises radiation sensitive group, thus there is no need to add other photoactive component (PAC) to the resist formulation. However, in some cases, it may be desirable to add PAC to the formulation to enhance the lithographic performance of the resist.

The resist compositions may further include surfactants, sensitizers or other expedients known in the art. The compositions of the present invention are not limited to any specific selection of these expedients. Examples of possible surfactants include fluorine-containing surfactants such as the FLUORAD™ series, preferably FC-430, and more preferably, FC-4430, both available from 3M Company in St. Paul, Minn., and siloxane-containing surfactants such as the SIL-WET® series available from Union Carbide Corporation in Danbury, Conn.

The invention also includes methods of making such lithographic structures and methods of using such lithographic structures to pattern underlying material on a substrate. The resist compositions of the invention are useful in single layer lithographic processes, and are especially useful as imaging layers in multilayer lithographic processes, such as bi-layer or tri-layer processes.

The methods of the invention preferably comprise:
(a) providing a substrate;
(b) applying a resist composition to the substrate to form a resist layer on the substrate, the resist composition comprising a resist composition of the invention,
(c) patternwise exposing the resist layer to imaging radiation, whereby portions of the resist layer become preferentially more soluble in aqueous base,
(d) removing the soluble portions of the resist layer to form a pattern of spaces in the resist layer, and
(e) transferring the pattern of spaces to the substrate.

The invention is not limited to any specific substrate material or structure. The substrate may include one or more distinct material layers on its surface to be patterned or may be homogeneous at its surface (e.g., an unprocessed semiconductor wafer). The substrate preferably includes a suitable material useful in the formation of microelectronic structures, and is preferably selected from any of an organic dielectric, a metal, a ceramic or a semiconductor.

The methods of the invention include so-called single layer and multilayer (e.g., bi-layer or tri-layer) approaches. In the single layer approach, the resist layer is applied onto the substrate directly or onto an intermediate non-planarizing antireflective coating layer which may be applied to the substrate. In the multilayer approach, the resist is applied over a layer of a planarizing underlayer material previously applied to the substrate. If used, the planarizing underlayer material is preferably applied directly onto the substrate. The resist coating is preferably as thin as possible provided that the thickness is preferably substantially uniform and that the resist layer is sufficient to withstand subsequent processing (typically reactive ion etching (RIE)) to transfer the lithographic pattern to the substrate, in the case of the single layer approach, or to the planarizing underlayer, in the case of a multilayer approach.

If used, the planarizing underlayer should be sufficiently etchable, selective to the overlying resist (to yield a good profile in the etched underlayer) while being resistant to the etch process needed to pattern the underlying material of the substrate. Additionally, the planarizing underlayer composition should have the desired optical characteristics (e.g., refractive index, optical density, etc.) such that the need for any additional antireflective coating (ARC) layer is avoided. The planarizing underlayer composition should also have physical/chemical compatibility with the resist layer to avoid unwanted interactions which may cause footing and/or scumming. Preferably, the planarizing underlayer compositions are characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker, as described in US Published Patent Application No. US 2002/0058204 A1, published May 16, 2002, the disclosure of which is incorporated herein by reference. Most preferably, a portion of the above-mentioned planarizing underlayer composition further comprises fluorinated polycyclic moieties and/or fluorinated aromatic moieties.

Optionally, the substrate with the resist coating may be heated (pre-exposure bake or post-apply bake (PAB)) to remove the solvent and improve the coherence of the resist layer. The PAB step is preferably conducted for about 10 seconds to about 15 minutes, more preferably about 15 seconds to about two minutes. The PAB temperature may vary depending on the $T_g$ of the resist.

The resist compositions of the invention may be patterned using various radiation types such as 365 nm wavelength, deep-UV (specifically 248 nm, 193 nm, and 157 nm wavelengths), extreme-UV (approximately 13 nm wavelength), x-ray, electron beam, and ion beam. The appropriate radiation type(s) may depend on the components of the overall resist composition (e.g., the selection of the polymer component, surfactant, solvent, etc.). A preferred imaging radiation is electron beam. Where scanning particle beams, such as electron beam, are used, patternwise exposure may be achieved by scanning the beam across the substrate and selectively applying the beam in the desired pattern. Wavelike radiation sources, such as 193 nm or 157 nm UV radiation, are typically projected through a mask to provide patternwise radiation exposure to the resist.

Optionally, the patternwise exposed resist layer may be baked (post-exposure bake or PEB) between the radiation exposure and developing steps to facilitate the removal of the radiation cleaved groups in the radiation-exposed portions of the resist layer and to enhance the contrast of the exposed pattern. If PEB is used, it is preferably to be conducted at about 10-175° C., more preferably about 25-120° C. The PEB is preferably conducted for about 30 seconds to 5 minutes. Generally, PEB is not necessary for the resist compositions of the invention.

The resist structure with the desired pattern is obtained (developed) by removal of the portions of the resist which were exposed to imaging radiation. Preferably, the removal is performed by contacting the resist layer with an alkaline solution that selectively dissolves the areas of the resist which were exposed to radiation. Preferred alkaline solutions (developers) are aqueous solutions of tetramethyl ammonium hydroxide (TMAH). The aqueous alkaline solution of TMAH preferably has a normality of about 0.14 N or greater, more preferably about 0.20 N or greater, most preferably about 0.26 N or greater. After the dissolution, the resulting lithographic structure on the substrate is then typically dried to remove any remaining developer solvent.

The removal of the exposed portions of resist creates a pattern of spaces which reveals area of the substrate, antireflective coating or planarizing underlayer depending on which approach was used above. The pattern of spaces in the resist layer may be transferred to the underlying substrate by removing portions of the substrate material through the pattern of spaces in the resist layer. Where an antireflective coating and/or planarizing underlayer have been employed, they would need to be removed at the spaces in the resist layer to expose portions of the substrate. Preferably, the antireflective coating and/or planarizing underlayer is removed by etching, more preferably by $O_2$ plasma reactive ion etching (RIE) or other anisotropic etching techniques. Once the desired portions of the substrate are revealed, the pattern may be transferred to portions of the substrate, for example, by etching (e.g., by reactive ion etching). Alternatively, the pattern transfer may comprise depositing a material (such as an organic dielectric, a metal, a ceramic or a semiconductor) onto the substrate at the spaces in the resist layer (or planarizing underlayer), or by implanting dopants into the substrate material at the spaces in the resist layer (or planarizing underlayer).

Once the desired pattern transfer has taken place, any remaining underlayer and resist may be removed by using conventional stripping techniques.

The following examples are provided to further describe the present invention. The invention is not limited to the details of the examples.

Example 1

Synthesis of Camphanic Group Partially Protected Poly(2-Hydroxy-3,3,3-Trifluoropropylsilsesquioxane) (FSQ-CAF)

7 g of poly(2-hydroxy-3,3,3-trifluoropropylsilsesquioxane) (FSQ) and 4.14 g of camphanic chloride were dissolved in 35 g of GBL and charged into a 100 ml flask. The mixture was stirred under ice bath, while 1.93 g of 4-methylmorpholine was added into the mixture dropwise within 20 minutes. After approximately two hours stirring under the ice bath temperature, the reaction mixture was allowed to warm up slowly to the room temperature and the reaction was continued overnight. The solution was then precipitated in 2000 ml DI water. The resulting gel-like polymer was redissolved in acetone and reprecipitated in 2000 ml DI water. The polymer was collected and dried in vacuum oven overnight at 65° C.

Example 2

Dissolution Rate and Optical Property Measurements of FSQ-CAF 800 mg of FSQ-CAF synthesized in Example 1 above was dissolved in PGMEA to a total weight of 10 g providing the solid content of the polymer in the solution is 8%. This radiation sensitive resist composition was then spin-coated on quartz disk and baked at 110° C. for 60 s. The disk containing resist film was then developed in 0.263N TMAH developer and monitored with Research Quartz Crystal Microbalance (RQCM, RS-232) tool manufactured by Maxtek, Inc. The dissolution rate of FSQ-CAF in comparison to that of FSQ is shown in Table 1 below.

TABLE 1

Dissolution rates evaluation

| Polymer | Dissolution rate |
|---------|------------------|
| FSQ     | 11.3 nm/s        |
| FSQ-CAF | 0.134 nm/s       |

To measure the optical properties, the resist composition above was spin coated onto silicon wafers, baked on hot plate at 110° C. for 60 s, and then n and k values were measured with VB-250 VASE Ellipsometer manufactured by J.A. Woollam Co. Inc. The optical properties of the resist composition film of the invention compared to that of FSQ with respect to 193 nm radiation are shown in Table 2 below.

TABLE 2

Optical properties evaluation

| Polymer | n at 193 nm | k at 193 nm |
|---------|-------------|-------------|
| FSQ     | 1.52        | 0.002       |
| FSQ-CAF | 1.56        | 0.02        |

Example 3

E-beam Imaging Evaluation

Resist formulation with 8% FSQ-CAF in Example 2 was spin coated with 2500 rpm on HMDS primed wafers. The resist was baked on a hot plate at 110° C. for 1 minute to give ~100 nm thick film. The exposures were performed on a 100 kV Leica exposure system. After exposure, the resist was developed with 0.263N TMAH for 60 s. High resolution of 60 nm l/s images was obtained at 420 μC/cm² with resist lines standing, and 50 nm l/s images were resolved with some lines collapsed. The contrast of the resist is around 3.

What is claimed is:

1. A method of forming a structure on a substrate, said method comprising:
   (a) providing a substrate;
   (b) applying a non-chemically amplified resist composition to said substrate to form a resist layer on said substrate; said resist composition consisting essentially of (i) an organosilsesquioxane polymer having a silsesquioxane backbone and pendent from a silsesquioxane backbone at least one radiation-sensitive moiety cleavable upon irradiation to form an aqueous base-soluble moiety, and (ii) a casting solvent, wherein said radiation sensitive moiety is selected from the group consisting of carbonyl, diazo, sulfonyl, alkanethiol, and O-nitrobenzyl,
   (c) patternwise exposing said substrate to imaging radiation, whereby said radiation sensitive moiety is cleaved to form aqueous base soluble moiety whereby portions of said resist layer become preferentially more soluble in aqueous base,
   (d) removing said soluble portions of said resist layer to form a pattern of spaces in said resist layer, and
   (e) transferring said pattern of spaces to said substrate.

2. The method of claim 1, wherein said radiation sensitive moiety is

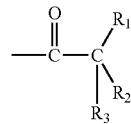

wherein each of $R_1$, $R_2$, or $R_3$ is selected from the group consisting of linear or branched alkyl, cycloalkyl, aryl and any combination thereof.

3. The method of claim 2, wherein at least one of $R_1$, $R_2$, or $R_3$ links to one or two of the others to form a cyclic structure.

4. The method of claim 2, wherein each of $R_1$, $R_2$, or $R_3$ further comprises at least one element selected from the group consisting of oxygen, sulfur, nitrogen, fluorine, chlorine, iodine and the combination thereof.

5. The method of claim 1 wherein said polymer further comprises at least one aqueous base soluble moiety.

6. The method of claim 5, wherein said at least one aqueous base soluble moiety is selected from the group consisting of hydroxyl, carboxylic acid, sulfonamide, dicarboxylmide, N-hydroxy dicarboxylmide, an amino group, and an imino group.

7. The method of claim 5, wherein said at least one aqueous base soluble moiety is a fluoroalcohol.

8. The method of claim 7, wherein said fluoroalcohol is trifluorocarbinol or hexafluorocarbinol.

9. The method of claim 1, further comprising forming a planarizing layer on said substrate prior to the formation application of said resist composition, and wherein said resist composition is applied directly over said planarizing layer.

10. The method of claim 1, wherein said step of transferring further comprises a method selected from the group consisting of depositing, implanting, electroplating and etching.

11. The method of claim 1, wherein said radiation-sensitive moiety is:

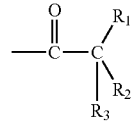

wherein each of $R_1$, $R_2$, or $R_3$ is selected from the group consisting of linear or branched alkyl, cycloalkyl, aryl and any combination thereof, wherein one of $R_1$, $R_2$, or $R_3$ is replaced with a moiety containing oxygen, sulfur, nitrogen, fluorine, chlorine, iodine.

12. The method of claim 11, wherein said radiation sensitive moiety is

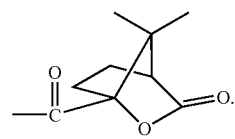

* * * * *

UNITED STATES PATENT AND TRADEMARK OFFICE
CERTIFICATE OF CORRECTION

| | |
|---|---|
| PATENT NO. | : 7,659,050 B2 |
| APPLICATION NO. | : 11/146871 |
| DATED | : February 9, 2010 |
| INVENTOR(S) | : James J. Bucchignano et al. |

It is certified that error appears in the above-identified patent and that said Letters Patent is hereby corrected as shown below:

Column 1, line 10
Prior to the background of the invention,
Please insert:
Notice of Government Rights
--This invention was made with Government support under N-6601-00-C-8083 awarded by DARPA. The Government has certain rights in this invention.--

Signed and Sealed this

Fifteenth Day of June, 2010

David J. Kappos
*Director of the United States Patent and Trademark Office*